United States Patent [19]

Miyatake

[11] Patent Number: 4,935,794
[45] Date of Patent: Jun. 19, 1990

[54] STRUCTURE AND DRIVING METHOD OF INTERLINE TRANSFER CCD IMAGE SENSOR

[75] Inventor: Shigehiro Miyatake, Osaka, Japan

[73] Assignee: Sharp Kabushiki Kaisha, Osaka, Japan

[21] Appl. No.: 894,712

[22] Filed: Aug. 8, 1986

Related U.S. Application Data

[63] Continuation of Ser. No. 515,038, Jul. 18, 1983, abandoned.

[30] Foreign Application Priority Data

Jul. 19, 1982 [JP] Japan .............................. 57-126552

[51] Int. Cl.⁵ ..................... H01L 29/78; H01L 27/14; H01L 31/00; G11C 19/28
[52] U.S. Cl. ....................................... 357/24; 357/30; 377/60
[58] Field of Search ................ 357/24 LR, 24 M, 30; 377/57-63

[56] References Cited

U.S. PATENT DOCUMENTS

| Re. 30,917 | 4/1982 | Hagiwara et al. | 357/24 LR |
| 3,789,267 | 1/1974 | Krambeck et al. | 357/24 |
| 3,856,989 | 12/1974 | Weimer | 357/24 LR |
| 4,117,514 | 9/1978 | Terui et al. | 357/30 |
| 4,489,423 | 12/1984 | Suzuki | 357/30 |
| 4,518,978 | 5/1985 | Takeshita | 357/24 LR |

FOREIGN PATENT DOCUMENTS

2103875 2/1983 United Kingdom .......... 357/24 LR

Primary Examiner—Gene M. Munson

[57] ABSTRACT

An interline transfer CCD image sensor includes a plurality of PN junction photosensor elements disposed in a matrix fashion. A plurality of columns of shift register are associated with the matrix aligned PN junction photosensor elements. Each CCD shift register includes a plurality of register elements, each of which includes a buried channel connected to a corresponding PN junction photosensor element via a transfer gate as a potential barrier. A register electrode formed on the buried channel is extended toward the corresponding PN junction photosensor element to cover the transfer gate as the potential barrier. Drive signals are applied to the register electrodes to control the charge transfer operation from the PN junction photosensor to the buried channel in addition to controlling the shift operation in the shift register, thereby eliminating the need for channel stoppers for isolating the photosensor elements.

5 Claims, 7 Drawing Sheets

STRUCTURE AND DRIVING METHOD OF INTERLINE TRANSFER CCD IMAGE SENSOR

This application is a continuation of application Ser. No. 515,038, filed on July 18, 1983, now abandoned.

BACKGROUND OF THE INVENTION

The present invention relates to a CCD (Charge Coupled Device) image sensor including PN junction photosensor elements, more particularly, to an isolation structure between photosensor elements of a CCD image sensor.

Recently, a solid state image sensor has developed for use in a color video camera as disclosed in U.S. Pat. Application No. 216,759, filed on Dec. 15, 1980, by S. MIYATAKE, entitled "Intergrated CCD Image Sensor of the Interline Transfer Type". The U. K. counterpart was published on July 1, 1981 as GB No. 2,065,974 A. The German counterpart was published on Sept. 10, 1981 as DE-OS No. 3,047,216. The disclosure of this patent application is incorporated by reference.

The method of the solid state image sensor can be classified as XY address image sensor type and a CCD image sensor type. Particularly, the CCD image sensor has developed owing to the advantage of an S/N ratio (Signal Noise ratio) because the output capacity of the CCD image sensor is relatively small an interline transfer CCD image sensor including PN junction photodiodes shows a high sensitivity to blue light, and shows a high resolution to use a mosaic color filter.

Conventional CCD image sensor has required a complicated structure to improve the characteristics, so that a great number of masks are necessary and mask slippage may cause problems. Hence, the accuracy of the CCD may be deteriorated.

SUMMARY OF THE INVENTION

Accordingly, an object of the present invention is to provide a simple structure for a CCD image sensor.

Another object of the present invention is to provide an improved structure of an interline transfer CCD image sensor in which the channel stoppers for isolating photodiodes can be eliminated.

A further object of the present invention is to cancel the variation in characteristics produced by mask alignment errors between channel stoppers and photodiodes, or between channel stoppers and shift register electrodes in the interline transfer CCD image sensor.

A further object of the present invention is to provide an improved driving method for an interline transfer CCD image sensor.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

According to the present invention, an interline transfer CCD image sensor includes a plurality of PN junction photosensor elements disposed in a matrix fashion. A plurality of columnal shift registers are associated with the matrix aligned PN junction photosensor elements. Each CCD shift register includes a plurality of register elements, each of which includes a buried channel connected to a corresponding PN junction photosensor element via a transfer gate for a potential barrier. A register electrode formed on the buried channel extends toward the corresponding PN junction photosensor element to cover the transfer gate as the potential barrier. Drive signals are applied to the register electrodes to control the charge transfer operation from the PN junction photosensor to the buried channel in addition to controlling the shift operation in the shift register, thereby eliminating the need for channel stoppers for isolating the photosensor elements.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

In order to facilitate a more complete understanding of the present invention, the conventional interline transfer CCD image sensor including PN junction photosensor elements, for example, photodiodes, will be first described with reference to FIGS. 1(a)-1(c).

Figure 1A:
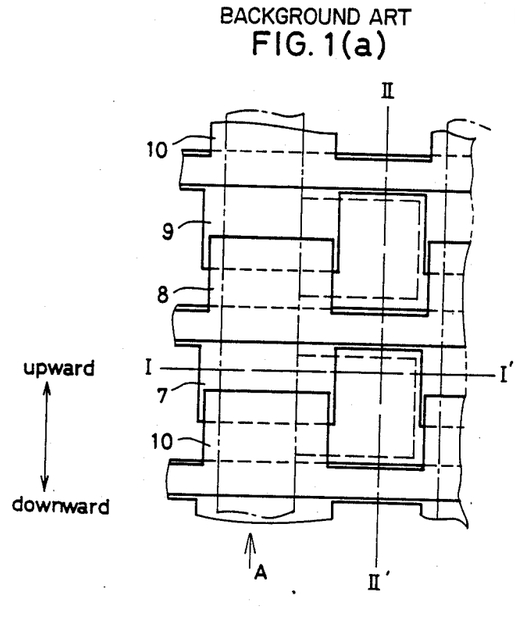
FIG. 1(a) is a plan view of an essential part of the conventional interline transfer CCD image sensor.

FIG. 1(a) is a plan view of an essential part of the conventional interline transfer CCD image sensor. FIG. 1(b) is a sectional view taken along line I-I' of FIG. 1. FIG. 1(c) is a sectional view taken along line II-II' of FIG. 1. An N− diffusion layer 2 is formed on a P-type semiconductor substrate 1 to provide a buried channel for a CCD shift register. An N diffusion layer 3 is also formed on the P-type semiconductor substrate 1 to provide a PN junction photodiode. The N− diffusion layer 2 and the N diffusion layer 3 are formed with a predetermined distance therebetween. A plurality of columns of CCD shift registers are formed in the P-type semiconductor substrate 1. Each of CCD shift registers includes a plurality of CCD shift register elements. A photodiode corresponds to each of CCD shift register elements. The N$^-$ diffusion layer 2 and the N diffusion layer 3 are connected via a P-type semiconductor transfer gate region 5. An highly doped P-type semiconductor channel stopper 4 is formed in the substrate 1 except the portions 8 substrate 1 having the N$^-$ diffusion layer 2, the N diffusion layer 3, and the transfer gate 5, which functions as a potential barrier.

On the other hand, an insulator 6 made of $SiO_2$ is formed on the semiconductor substrate 1 to cover the substrate surface. Polysilicon electrodes 7, 8, 9, and 10 for the shift registor elements are formed on the insulator 6 of the P-type semiconductor substrate 1. The polysilicon electrodes 7 and 9 are formed as the first-stage layer electrodes, and the polysilicon electrodes 8 and 10 are formed as the second-stage layer electrodes. An insulator film 11 made of $SiO_2$ is interpositioned between the electrodes of different layers, to isolate the electrodes, respectively. The polysilicon electrodes 7, 8, 9 and 10 are formed above the N$^-$ diffusion layer 2 and the transfer gate 5 of the shift registor. The aluminum light shield 12 is formed on the N$^-$ diffusion layer 2 for the shift register and the transfer gate region 5.

Figure 2:
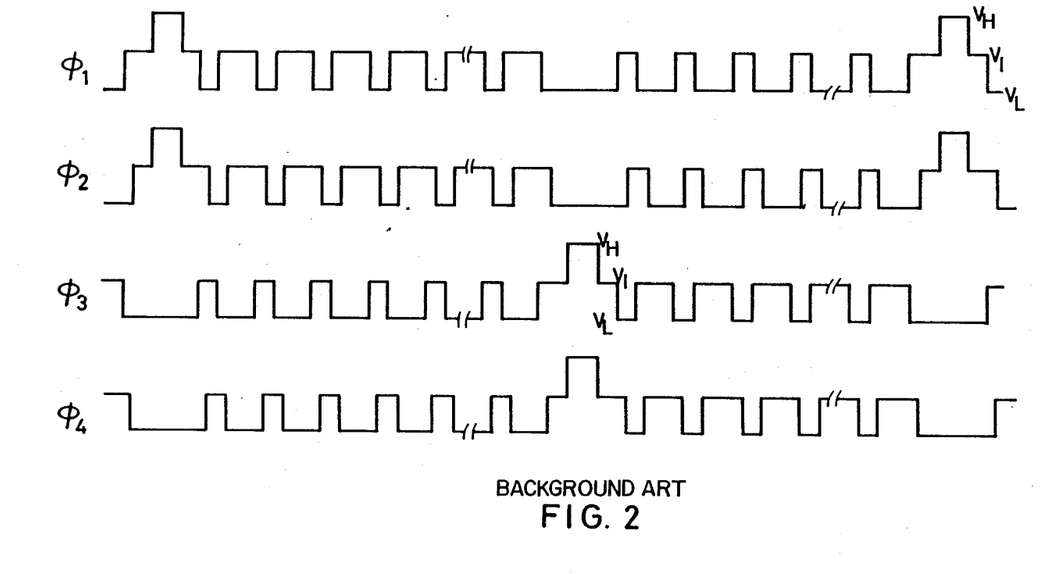
FIG. 2 is a time chart showing drive signals applied to the conventional interline transfer CCD image sensor of FIGS. 1(a)-1(c)

Clock signals $\phi_1$, $\phi_2$, $\phi_3$ and $\phi_4$ as shown in FIG. 2 are applied to the polysilicon electrodes 10, 7, 8 and 9, respectively. The clock signals $\phi_1$, $\phi_2$, $\phi_3$ and $\phi_4$ have three signal levels $V_L$, $V_I$ and $V_H$. When the clock signal shows the signal level $V_L$ or $V_I$, signal charges condensed in the shift register element are transfered in the direction A of FIG. 1(a). (upward) When the clock signal shows the signal level $V_H$, signal charge condensed in the photodiodes 3 are transfered to the adjacent shift register element via the transfer gate region 5, horizontally.

In the CCD image sensor having the above construction, the electrodes of the shift register elements are provided for wiring on the P-type semiconductor substrate between neighboring photodiodes. When the clock signals applied to the shift register elements shows a high signal level, the channel stopper 4 is needed to provide under the wiring to prevent a charge mixing or crosstalk between the neighboring photodiodes. Because the channel stopper 4 are prepared by different steps, variations in characteristics owing to masking slips are produced.

An embodiment of the present invention can avoid the above problems and will be described as follows.

Figure 3A:
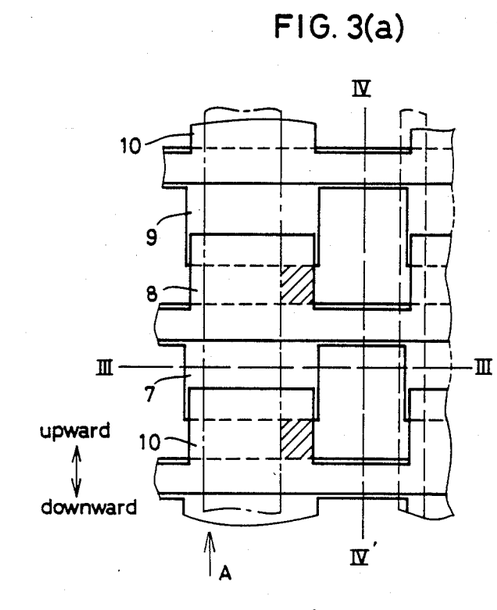
FIG. 3(a) is a plan view of an essential part of the interline transfer CCD image sensor of an embodiment of the present invention.
Figure 3B:
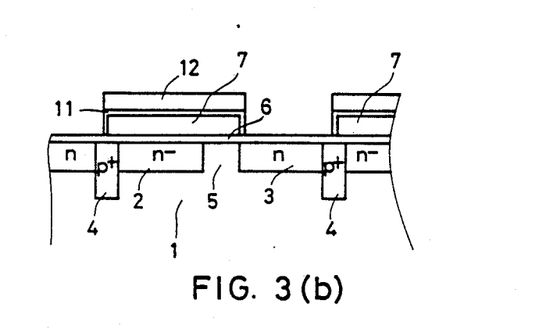
FIG. 3(b) is a sectional view taken along line III-III' of FIG. 3(a)
Figure 3C:
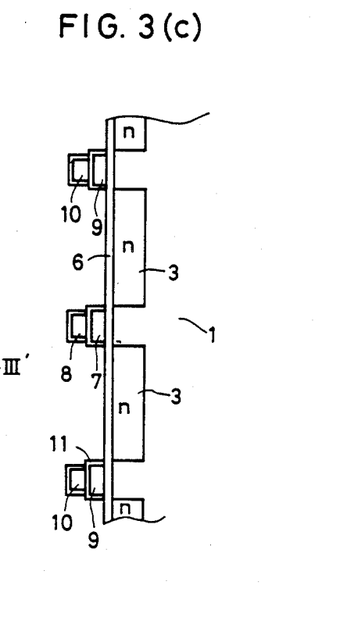
FIG. 3(c) is a sectional view taken along line IV-IV' of FIG. 3(a)

FIGS. 3(a)-3(c) show a CCD image sensor according to an embodiment of the present invention. Like elements corresponding to those of FIGS. 1(a)-1(c) are indicated by like numerals. The difference between the CCD image sensors of FIGS. 1(a)-1(c) and FIGS. 3(a)-3(c) is described as follows.

A channel stopper is not untilized between N diffusion layers 3 forming a photodiode as shown in FIG. 3(c). The channel stopper 4 is provided only between N diffusion layer 3 for the photodiode and the N$^-$ diffusion layer 2 for the shift register as shown in FIG. 3(b). In this construction, variations in CCD characteristics caused by masking slips or overlapping between the photodiodes and the channel stopper can be remarkably reduced. The N diffusion layer 3 for the photodiode may be formed by the self-alignment for the polysilicon electrodes 7, 8, 9 and 10.

Figure 1B:
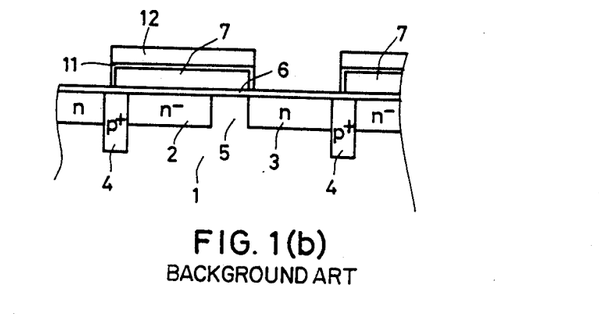
FIG. 1(b) is a sectional view taken along line I-I' of FIG. 1(a)
Figure 1C:
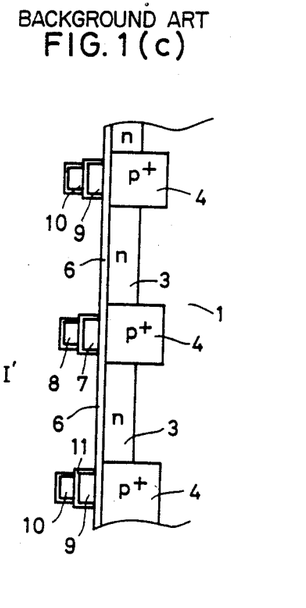
FIG. 1(c) is sectional view taken along line II-II' of FIG. 1(a)
Figure 4:
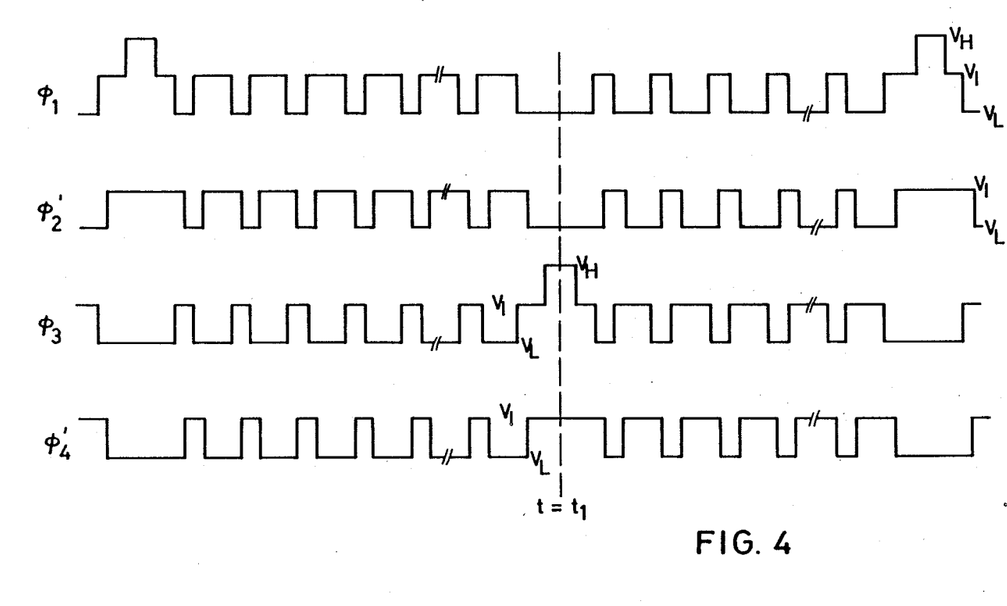
FIGS. 4 and 5 are timing charts showing drive signals applied to the interline transfer image sensor of FIGS. 3(a)-3(c) and FIGS. 7(a)-7(b)

Electrodes 10, 7, 8 and 9 are formed on the semiconductor substrate 1 made of silicon as being similar to FIGS. 1(a)-1(c). Clock signals $\phi_1$, $\phi'_2$, $\phi_3$ and $\phi'_4$ as shown in FIG. 4 are applied to the electrodes 10, 7, 8 and 9, respectively. The clock signals $\phi'_2$ and $\phi'_4$ applied to the first-stage layer polysilicon electrodes 7 and 9 vary between signal levels $V_L$ and $V_I$. The clock signals $\phi_1$ and $\phi_3$ applied the second-stage layer polysilicon electrodes 10 and 8 vary among signal levels $V_L$, $V_I$, and $V_H$.

When the clock signal $\phi_1$ or $\phi_3$ shows the signal level $V_H$, signal charges condensed in the photodiode are transferred into the adjacent shift register element through the portion just under the electrode 10 or 8 as shown in the oblique line area in FIG. 3(a), horizontally. Though the photodiodes are not isolated by the channel stopper, the clock signals applied to the electrodes 7 and 9 which are located between the photodiodes are in the signal level $V_L$ or $V_I$ in order to prevent a signal charge mixing or cross talk.

When the clock signal $\phi_1$ or $\phi_3$ is varied between the signal levels $V_L$ and $V_I$, the signal charges in the shift register element are transferred into the adjacent shift register element in the direction A as shown in FIG. 3(a). (upward) In the above construction, the channel stopper between the photodiodes can be avoided.

Figure 5:
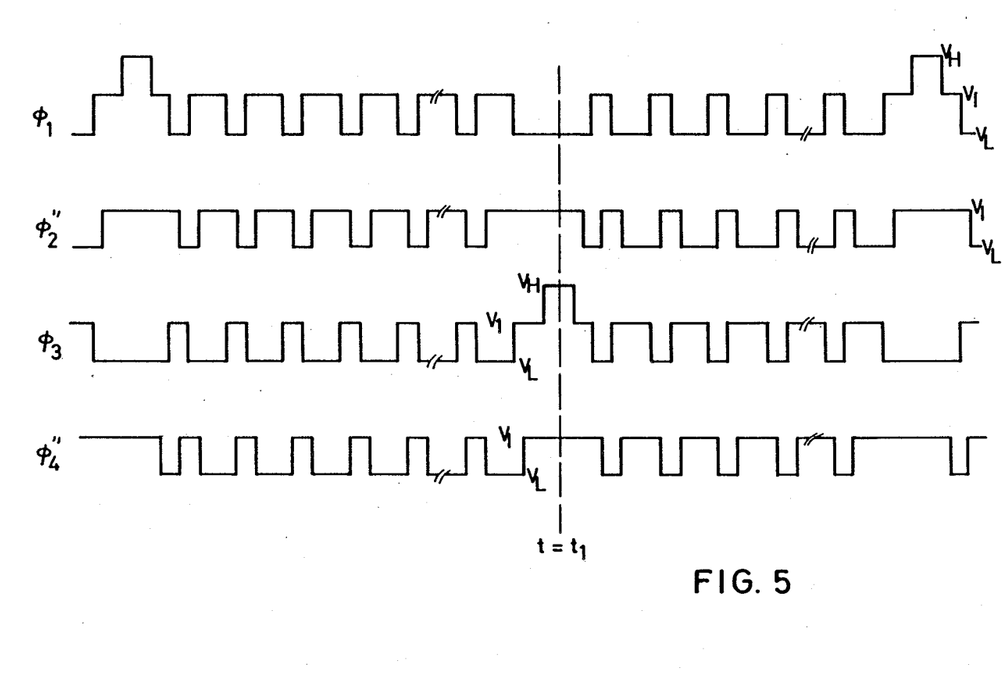

FIG. 5 is a time chart showing other drive signals applied to the embodiment of the present invention. Clock signals $\phi_1$, $\phi''_2$, $\phi_3$ and $\phi''_4$ as shown in FIG. 5 are applied to the electrodes 10, 7, 8 and 9, respectively. To enhance transfer efficiency, at least two different clock signals must simultaneously take the signal level $V_I$ at a preselected time. For example, the clock signals $\phi_1$ and $\phi_3$ take the signal level $V_1$ about a few tens ansec at a preselected time. But, this signal overlap is neglected in this description.

In FIG. 4, the clock signals $\phi_1$ and $\phi_3$, or $\phi'_2$ and $\phi'_4$ are converted with respect to each other except when the clock signals show the signal level $V_H$. In FIG. 5, on the contrary, when the clock signal $\phi_3$ shows the signal level $V_H$, the clock signal $\phi''_2$ shows the signal level $V_I$. When the clock signal $\phi_1$ shows the sigal level $V_H$, the clock signal $\phi''_4$ shows the signal level $V_I$.

This difference is essential for the interline transfer CCD image sensor of the present invention and will be described as follow.

Figure 6A:
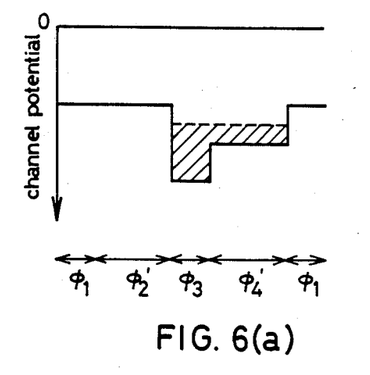
FIGS. 6(a) and 6(b) are schematic charts showing channel potential under the electrodes 10, 7, 8 and 9 receiving the clock signals at $t=t_1$ as shown in FIGS. 4 and 5, respectively.
Figure 6B:
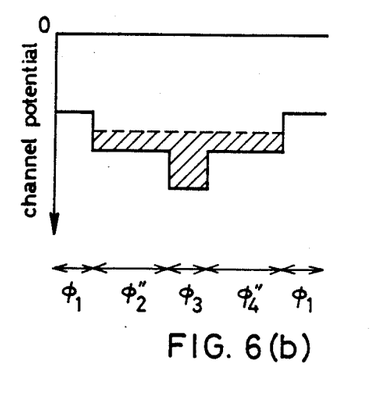

FIGS. 6(a) and 6(b) are schematic charts showing channel potential under the electrodes 10, 7, 8 and 9 receiving the clock signals at $t=t_1$ as shown in FIGS. 4 and 5, respectively.

In FIGS. 6(a) and 6(b), each dotted line shows a channel potential of the photodiode, so that each area under each dotted line indicates an charge amount. The amount of the signal charges of FIG. 6(b) is remarkably greater than that of the signal charges of FIG. 6(a) because the clock signal $\phi''_2$ shows the signal level $V_I$ at the beginning of the readout, $t=t_1$. In case that the clock signals of FIG. 5 are applied to the electrodes, the clock signals applied to the electrodes between the photodiodes vary between the signal levels $V_L$ and $V_I$. Accordingly, the signal charge mixing or cross talk between the photodiodes does not occur.

Figures 7A, 7C:
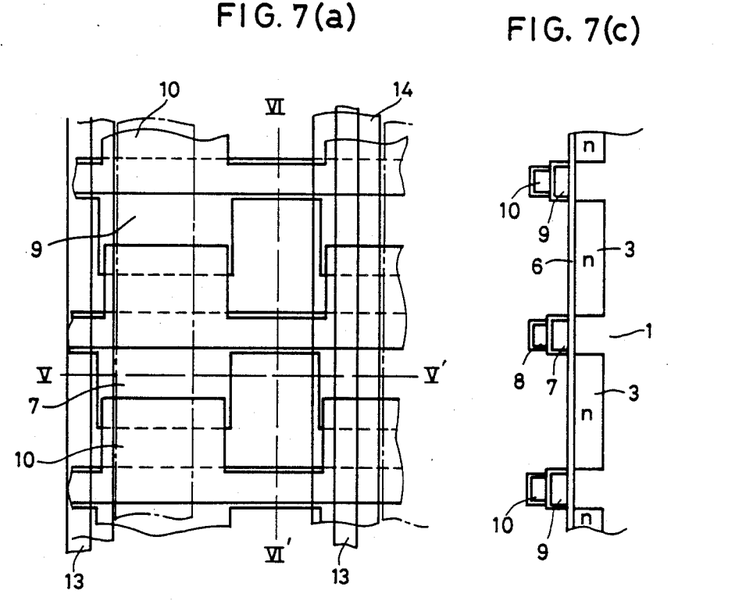
FIGS. 7(a) is a plan view of an essential part of the interline transfer CCD image sensor of another embodiment of the present invention.
FIG. 7(c) is a sectional view taken along line VI-VI' of FIG. 7(a).
Figure 7B:
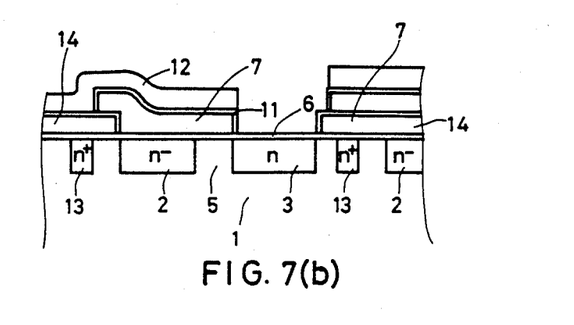
FIG. 7(b) is a sectional view taken along line V-V' of FIG. 7(a)

FIGS. 7(a)-7(c) show a CCD image sensor according to another embodiment of the invention. An overflow control gate 14 and an overflow drain 13 are provided in order to prevent the so-called blooming suppression. Since the clock signals as shown in FIGS. 4 and 5 are applied to the electrodes 10, 7, 8 and 9, the channel stopper between the photodiodes can be eliminated similar to the embodiment of FIG. 3. Further, if the overflow control gate electrode 14 is formed with the first-stage layer polysilicon, the photodiode and the shift register are isolated by the electrode 14, and the channel stopper between the photodiodes and the shift register can be eliminated.

According to the present invention, preferably, the shift register includes 580 register elements, vertically. An horizontal shift register is connected to 475 CCD vertical shift registers, whereby the 580×475 matrix image sensor is formed. A preferred frequency of the clock signals $\phi_1$, $\phi'_2$, $\phi''_2$, $\phi_3$, $\phi'_4$ and $\phi''_4$ is 15.625 KHz, and a preferred frequency of the horizontal shift register clock signals is 8.8125 MHz. Preferred voltage of the high ($V_H$), intermidiate ($V_I$), low ($V_L$) signal levels are 4.5 V, 0 V, −4.5 V, respectively.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An interline transfer CCD (charge coupled device) image sensor comprising:
    a CCD shift register including a plurality of CCD register elements, said CCD shift register being formed of a continuous diffusion layer semiconductor channel of a single semiconductor conductivity type;
    a plurality of PN junction photosensor elements aligned along said CCD shift register, each one of said plurality of PN junction photosensor elements being associated with a corresponding one of said plurality of CCD register elements to form a sensor unit;
    a transfer gate interposed between said each one of said plurality of PN junction photosensor elements and said corresponding one of said plurality of CCD register elements in said sensor unit;
    said corresponding one of said plurality of CCD register elements including,
        a portion of said continuous diffusion layer semiconductor channel, and
        register electrode means formed on said semiconductor channel for performing a shift operation in said CCD shift register, said register electrode means being extended toward said one of said plurality of PN junction photosensor elements to cover said transfer gate and reach the edge of said one of said plurality of PN junction photosensor elements included in said sensor unit, said register electrode means consisting essentially of a plurality of alternating first and second electrodes; and
    means for driving said register electrode means to transfer light intensity information to each said register element from its corresponding photosensor element and to shift said intensity information along said shift register;
    said means for driving applying first and second signals to all said first and second electrodes, respectively;
    said means for driving providing isolation between adjacent said photosensor elements by applying differential voltages to adjacent first and second electrodes to develop a differential potential between said adjacent photosensor elements;
    said photosensor elements being solely isolated by said differential potential developed by said means for driving.

2. The sensor of claim 1 wherein each first electrode is a transfer register electrode;
    said means for driving transfers said light intensity information from a said photosensor element to said corresponding one of said plurality of CCD register elements by applying a first voltage to a said transfer register electrode associated with said corresponding one of said CCD register elements while applying a voltage lower than said first voltage to a said second electrode adjacent to said transfer register electrode.

3. The sensor of claim 2 wherein said means for driving alternately applies second and third voltages to said register electrodes of said CCD shift register to transfer said light intensity information along said CCD shift register means, said second voltage being an intermediate voltage lower than said first voltage and higher than said third voltage.

4. An interline transfer CCD (charge coupled device) image sensor comprising:
    a CCD shift register including a plurality of CCD register elements, said CCD shift register being formed of a continuous diffusion layer semiconductor buried channel of a single semiconductor conductivity type formed in a substrate of an opposite conductivity type;
    a plurality of PN junction photosensor elements aligned along said CCD shift register, each one of said plurality of PN junction photosensor elements being associated with a corresponding one of said plurality of CCD register elements to form a sensor unit;
    a transfer gate interposed between said each one of said plurality of PN junction photosensor elements and said corresponding one of said plurality of CCD register elements in said sensor unit;
    said corresponding one of said plurality of CCD register elements including,
        a portion of said continuous diffusion layer semiconductor buried channel, and
        register electrode means formed on said semiconductor channel for performing a shift operation in said CCD shift register, said register electrode means being extended toward said one of said plurality of PN junction photosensor elements to cover said transfer gate and reach the edge of said one of said plurality of PN junction photosensor elements including in said sensor unit, said register electrode including two electrodes associated with each said photosensor element; and
    means for driving said register electrode means to transfer light intensity information from a said photosensor element to said corresponding one of said plurality of CCD register elements by applying a first voltage to a transfer register electrode of said register electrodes associated with said corresponding one of said CCD register elements while applying a voltage lower than said first voltage to said register electrodes adjacent to said transfer register electrode;
    said means for driving alternately applying second and third voltages to said register electrodes of said CCD shift register to transfer said light intensity information along said CCD shift register means, said second voltage being an intermediate voltage lower than said first voltage and higher than said third voltage;

said means for driving applying said second voltage to said register electrodes adjacent said transfer register electrode to enhance transfer efficiency by enlarging the potential well created by application of said first voltage to said transfer register electrode.

5. The sensor of claim 4 wherein said means for driving further defines said potential well by applying said third voltage to said register electrodes opposite the adjacent said register electrodes from said transfer register electrode.

* * * * *